US012721092B2

(12) United States Patent
Bentz

(10) Patent No.: US 12,721,092 B2
(45) Date of Patent: Aug. 25, 2026

(54) METHOD FOR ARRANGING A SEMICONDUCTOR PROCESSING TOOL ON A PEDESTAL

(71) Applicant: LAM RESEARCH CORPORATION, Fremont, CA (US)

(72) Inventor: Travis Bentz, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 831 days.

(21) Appl. No.: 17/908,587

(22) PCT Filed: Mar. 1, 2021

(86) PCT No.: PCT/US2021/020188
§ 371 (c)(1),
(2) Date: Sep. 1, 2022

(87) PCT Pub. No.: WO2021/178267
PCT Pub. Date: Sep. 10, 2021

(65) Prior Publication Data

US 2023/0097597 A1 Mar. 30, 2023

Related U.S. Application Data

(60) Provisional application No. 62/984,122, filed on Mar. 2, 2020.

(51) Int. Cl.

| | |
|---|---|
| ***H05K 3/30*** | (2026.01) |
| ***H10P 72/00*** | (2026.01) |
| ***H10P 72/30*** | (2026.01) |

(52) U.S. Cl.
CPC ...... *H10P 72/0456* (2026.01); *H10P 72/3221* (2026.01)

(58) Field of Classification Search
CPC ........... H01L 21/67173; H01L 21/6719; H01L 21/67733
See application file for complete search history.

(56) References Cited

U.S. PATENT DOCUMENTS

| | | | | |
|---|---|---|---|---|
| 11,127,572 | B2 * | 9/2021 | Chen ................ | H01J 37/32715 |
| 2001/0002523 | A1 | 6/2001 | Chen | |

(Continued)

FOREIGN PATENT DOCUMENTS

| | | | |
|---|---|---|---|
| JP | S63155001 | A | 6/1988 |
| JP | H0515644 | A | 1/1993 |

(Continued)

OTHER PUBLICATIONS

International Search Report and Written Opinion of the ISA issued in PCT/US2021/020188, mailed Jun. 21, 2021; ISA/KR.

(Continued)

*Primary Examiner* — Paul D Kim

(57) ABSTRACT

A method for arranging a substrate processing tool on a pedestal within a semiconductor fabrication room includes supporting a plurality of pedestal plates on a pedestal frame including a plurality of stanchions. The method further includes determining dimensions of the pedestal plates, determining locations of installation features of the pedestal plates in accordance with components of the substrate processing tool, machining the installation features in the pedestal plates based on the determined locations, marking at least one of the pedestal plates with at least one alignment feature, and installing the pedestal frame on a subfloor of the semiconductor fabrication room. The stanchions of the pedestal frame are positioned such that a weight distribution of the pedestal frame on the subfloor is different from a weight distribution of the substrate processing tool.

9 Claims, 8 Drawing Sheets

(56) References Cited

U.S. PATENT DOCUMENTS

| | | | | |
|---|---|---|---|---|
| 2004/0079289 | A1* | 4/2004 | Kellerman | H01L 21/67109 118/728 |
| 2007/0111536 | A1* | 5/2007 | Shinozaki | H01L 21/67259 438/758 |
| 2017/0092516 | A1 | 3/2017 | van Gogh et al. | |
| 2017/0110351 | A1 | 4/2017 | Trussell et al. | |
| 2018/0233387 | A1 | 8/2018 | Daugherty et al. | |

FOREIGN PATENT DOCUMENTS

| | | | |
|---|---|---|---|
| JP | H05156444 | A | 6/1993 |
| JP | H10135089 | A | 5/1998 |
| JP | 2000150622 | A | 5/2000 |
| JP | 2005271134 | A | 10/2005 |
| JP | 2008107213 | A | 5/2008 |
| JP | 4154816 | B2 | 9/2008 |
| JP | 2013168532 | A | 8/2013 |
| JP | 2017069564 | A | 4/2017 |
| JP | 2017079329 | A | 4/2017 |
| KR | 1020080038006 | A | 5/2008 |
| KR | 1020170054241 | A | 5/2017 |

OTHER PUBLICATIONS

Korean Office Action from corresponding Application No. 10-2022-7034188, dated Dec. 18, 2024.

Japanese Office Action from corresponding Application No. 2022-552719, dated Oct. 22, 2024.

Decision to Grant a Patent from Corresponding Japanese Application No. 2022552719, Dated Mar. 12, 2025.

Decision for Grant received for related Korean Patent Application No. 10-2022-7034188 dated Apr. 2, 2026.

* cited by examiner 100
102
104
106
107
108
110
112
W

Tool
Tool
Tool
Controller
Coordinates
510
510
510
520
522
524
526
528
530
530
580
582
584
590
594
500

METHOD FOR ARRANGING A SEMICONDUCTOR PROCESSING TOOL ON A PEDESTAL

CROSS-REFERENCE TO RELATED APPLICATIONS

This application is a U.S. National Phase Application under 35 U.S.C. 371 of International Application No. PCT/US2021/020188, filed on Mar. 1, 2021, which claims the benefit of U.S. Provisional Application No. 62/984,122, filed on Mar. 2, 2020. The entire disclosures of the applications referenced above are incorporated herein by reference.

FIELD

The present disclosure relates to substrate processing systems and more particularly to a pedestal for a semiconductor processing tool.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

SUMMARY

A method for arranging a substrate processing tool on a pedestal within a semiconductor fabrication room includes supporting a plurality of pedestal plates on a pedestal frame including a plurality of stanchions. The method further includes determining dimensions of the pedestal plates, determining locations of installation features of the pedestal plates in accordance with components of the substrate processing tool, machining the installation features in the pedestal plates based on the determined locations, marking at least one of the pedestal plates with at least one alignment feature, and installing the pedestal frame on a subfloor of the semiconductor fabrication room. The stanchions of the pedestal frame are positioned such that a weight distribution of the pedestal frame on the subfloor is different from a weight distribution of the substrate processing tool. The method further includes installing the pedestal plates on the pedestal frame in accordance with the installation features in the pedestal plates and the at least one alignment feature.

In other features, the method further includes installing the substrate processing tool on the pedestal plates. An overall footprint of the pedestal is greater than an overall footprint of the substrate processing tool. The installation features include at least one of access holes for the components of the substrate processing tool and mounting locations for the pedestal plates. The at least one alignment feature includes an axis of the pedestal plate.

In other features, the method further includes generating an installation template indicating the locations of the installation features and machining the installation features in the pedestal plates using the installation template. The installation template is a transparent sheet indicating the locations of the installation features. Installing the pedestal plates includes installing the at least one of the pedestal plates with the at least one alignment feature and installing remaining ones of the pedestal plates based on the at least one alignment feature. The method further includes orienting the at least one pedestal plate with the at least one alignment feature using an overhead transport system. The method further includes installing a plurality of the substrate processing tools on the pedestal plates.

A pedestal for supporting a substrate processing tool above a subfloor of a semiconductor fabrication room includes a pedestal frame including a plurality of stanchions and a plurality of pedestal plates supported on the pedestal frame. An overall footprint of the plurality of pedestal plates is greater than an overall footprint of the substrate processing tool, each of the pedestal plates includes installation features located in accordance with components of the substrate processing tool, at least one of the pedestal plates includes at least one alignment feature, and the stanchions are positioned such that a weight distribution of the pedestal frame on the subfloor is different from a weight distribution of the substrate processing tool.

In other features, a system includes the pedestal and further includes the substrate processing tool supported on the pedestal. The system further includes a plurality of the substrate processing tools supported on the pedestal. The installation features include at least one of access holes for the components of the substrate processing tool and mounting locations for the pedestal plates. The at least one alignment feature includes an axis of the pedestal plate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
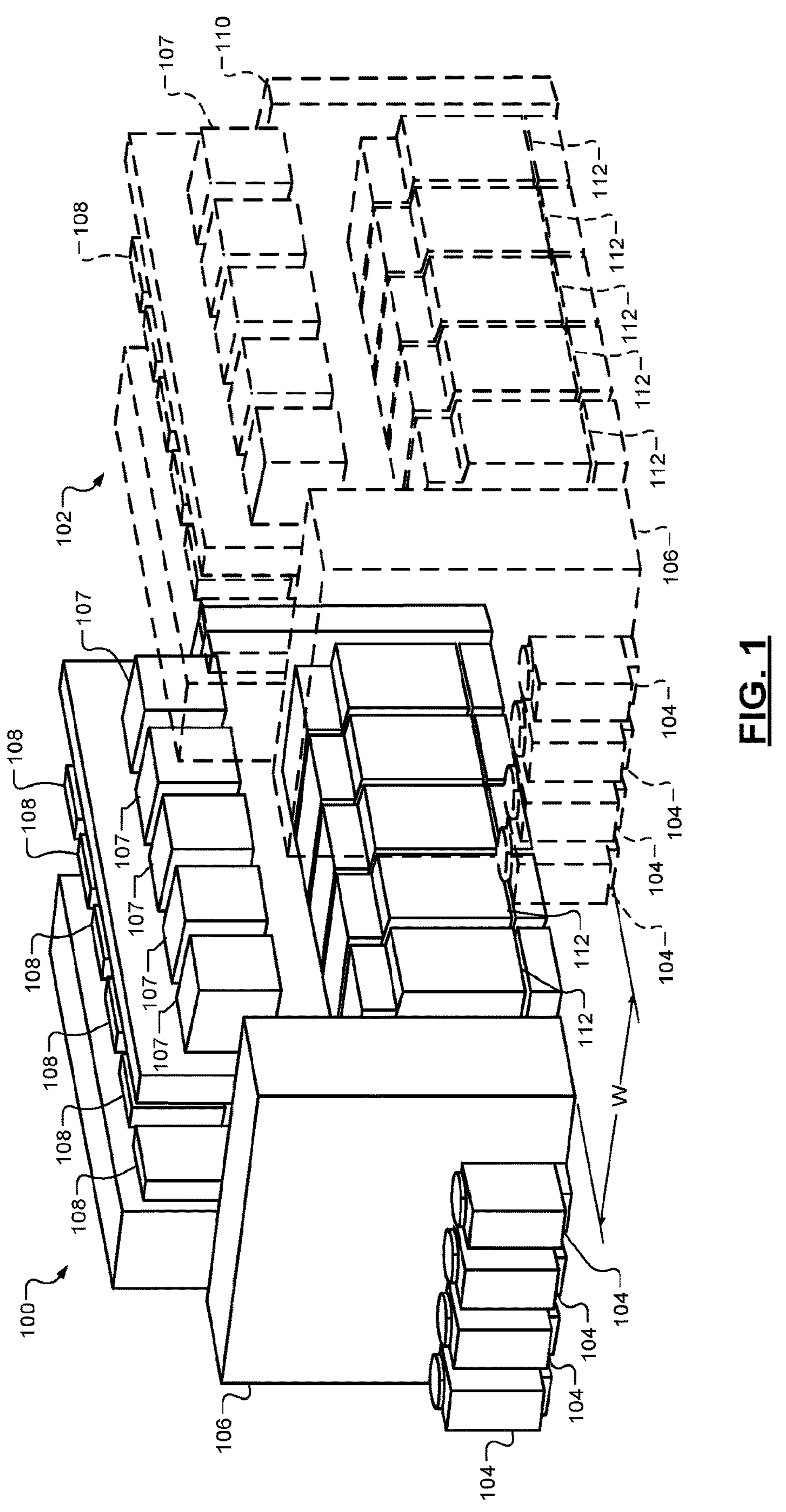
FIG. 1 is a perspective view of portions of two tools including example slide and pivot assemblies.

A semiconductor fabrication (fab) room may include multiple tools each including multiple substrate processing stations (hereinafter referred to as "stations"). Each of the stations can be configured to perform a conductor etch process, a dielectric etch process or other substrate treatment. Space within the fab room is limited and thus the amount of space available to access each of the tools to perform service and/or maintenance on a station is limited. The stations of the tools may be arranged in a star-shaped pattern or a linear pattern.

In the star-shaped pattern, the stations are arranged around a centrally located substrate transfer module including a robot. The robot moves substrates from a load lock chamber to each of the substrate processing stations and back to the load lock. Although this arrangement of stations provides some access space between stations for maintenance and/or service, the density of stations is less than the density of stations arranged in the linear pattern.

In the linear pattern, the stations are arranged side-by-side and form two rows of stations. The rows are located on opposite sides of the substrate transfer module, which may operate at atmosphere or vacuum. Although the linear-shaped arrangement allows for more stations to be disposed within a dedicated footprint, the linear-shaped arrangement provides restricted access to sides of the stations.

The stations are designed such that each station fits within a footprint (and a vertical column above the footprint) to allow tight packaging and a reduced overall tool footprint. That means, however, that the stations and the tool have a high weight per unit area as compared to prior tools. In other words, the components of each station are packed very tightly together and the weight distributed across the reduced footprint is relatively high. As a result, removable tiles that are typically used as the fab room floor above the subfloor are structurally insufficient to handle the loads.

The present disclosure relates to a pedestal including pedestal plates that are supported by a subfloor frame. A fab tool is located on the pedestal plates. The pedestal plates are machined to include access holes for providing connections to the stations from below. The pedestal plates are also machined to include mounting holes for connecting to components of the stations or the tool. The pedestal plates are also marked with alignment features such as a first axis and a second axis that are used to align the tool on the pedestal plates. An overhead transport (OHT) of the fab room is used to align one or more of the plates relative to the fab room. In some examples, a transparent film or sheet with cutouts and/or markings corresponding to the access holes, mounting holes and/or other features of the pedestal plates are used to align one or more of the pedestal plates. In other examples, a visual template (a light or laser template) including the cutouts and/or markings may be projected onto one or more of the pedestal plates.

Figure 2:
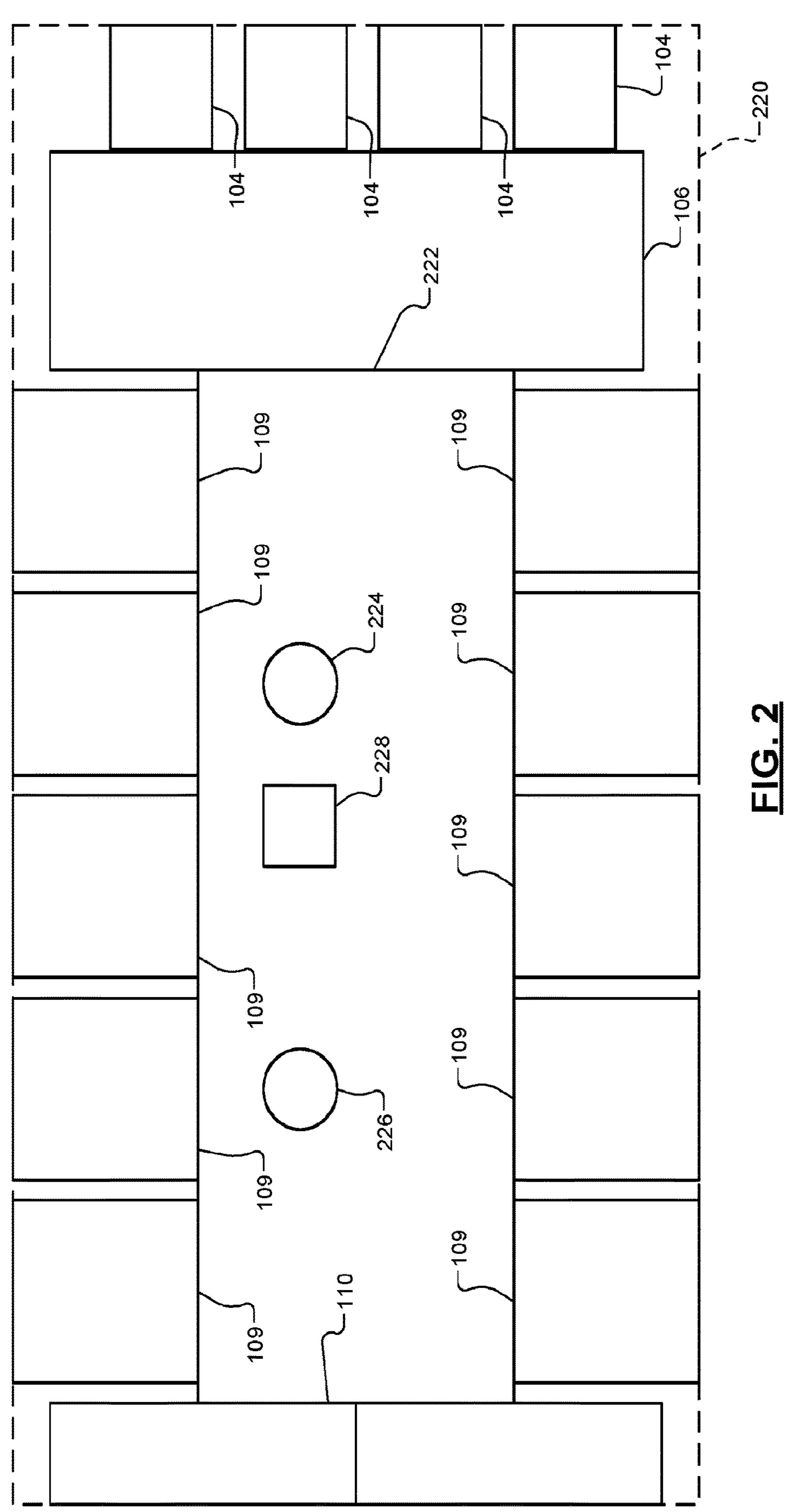
FIG. 2 is a top view of a portion of one of the tools of FIG. 1.

FIGS. 1 and 2 show portions of two tools 100, 102 (one in solid lines at 100 and the other in dashed lines at 102) disposed side-by-side in a fab room. Each of tools includes two rows of stations (one row is shown for each of the tools). The stations are located adjacent to a substrate transfer module (not depicted in FIG. 1 for clarity). There is limited space between the tools 100, 102. As an example, a width W of an aisle between the tools 100, 102 may be 1030 mm. This provides a minimal amount of space between the tools 100, 102 to open processing chambers of the stations and obtain access to process modules and interiors of corresponding processing chambers.

The examples set forth herein include slide and pivot assemblies to be pulled out and pivoted away from corresponding processing chambers and to allow service or maintenance to be performed in the aisle. The slide and pivot assemblies are configured to repeatedly move from a fully docked state to a fully undocked state and to the same fully docked locations. As an example, the slide and pivot assemblies are configured to return the process module bias assemblies to locations within ±25 micrometers (μm, referred to as microns) of the fully docked state. The slide and pivot assemblies are configured to handle and compensate for the heavy loads of the process module bias assemblies. An example overall weight of a process module bias assembly and corresponding slide and pivot assembly is around 300 kilograms (kg).

The tools 100, 102 include: front opening unified pod (FOUP) interfaces 104; an equipment front end module (EFEM) and load lock 106; stations with radio frequency generators 107 and gas boxes 108; and a power lock out and tag out panel 110. The stations further include process module bias assemblies 112, which include respective slide and pivot assemblies (shown in FIG. 4).

Each of the stations alone or in combination may be referred to as a substrate processing system. Each of the stations may be used to etch substrates using, for example, radio frequency (RF) plasma. Each station includes a processing chamber, such as an inductively coupled plasma (ICP) chamber or a conductively coupled plasma (CCP) chamber. The stations may, for example, perform conductive etch or dielectric etch processes or other substrate treatment.

FIG. 2 shows a plan view of the tool 100. The tool 100 includes the FOUP interfaces 104, the EFEM and load lock 106, the stations 109, and the power lock out and tag out panel 110. The tool has an overall footprint 220. The tool further includes a substrate transfer module 222 for transferring substrates to and from the stations 109. The substrate transfer module 222 may include robots 224, 226 and a buffer 228 for temporary storage of substrates. The robots 224, 226 transfer substrates to and from the stations 109 and the buffer 228. In some examples, the substrate transfer module 222 operates at vacuum or atmosphere.

Figure 3:
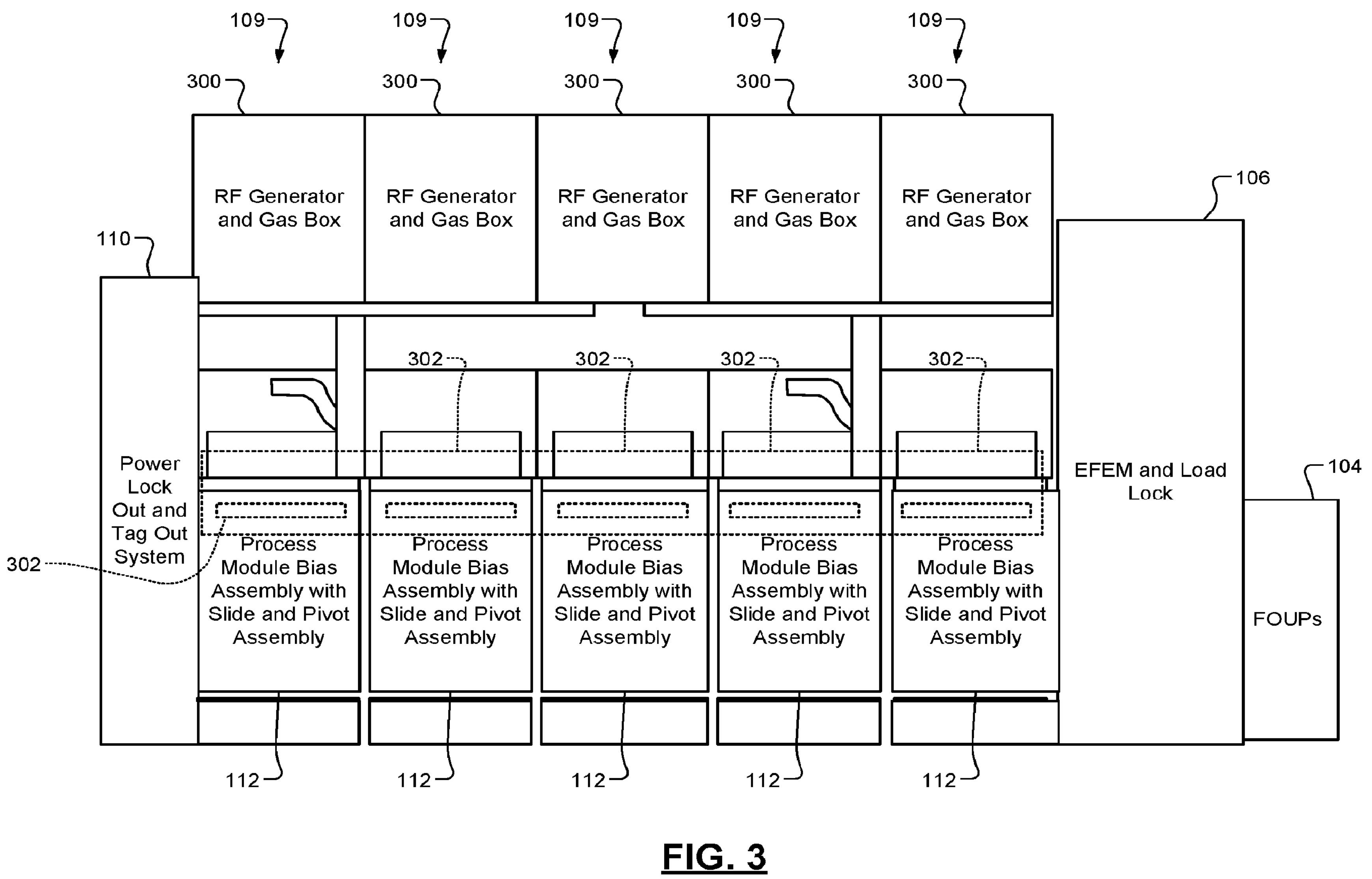
FIG. 3 is a side view of a portion of one of the tools of FIG. 1.

FIG. 3 shows is a side view of the tool 100. The tool 100 includes the FOUP interfaces 104, the EFEM and load lock 106, the stations 109, and the power lock out and tag out system 110. The stations include the RF generators and gas boxes (collectively referred designated 300) and the process module bias assemblies with slide and pivot assemblies 112. The RF generators may provide RF power to electrodes in substrate supports of the stations. The gas boxes supply gases to processing chambers of the stations. The substrate transfer module 222 is also shown.

Substrates scheduled to be loaded and processed are stored in the FOUP interfaces 104. The substrates are transferred by the robots 224, 226 from the FOUP interfaces 104 to the stations 109 via the EFEM and load lock 106 via respective loading ports 302. In some examples, the RF generators and gas boxes 300 are arranged above the stations 109 and supply RF power and process gases to process modules of the stations 109.

Figure 4B:
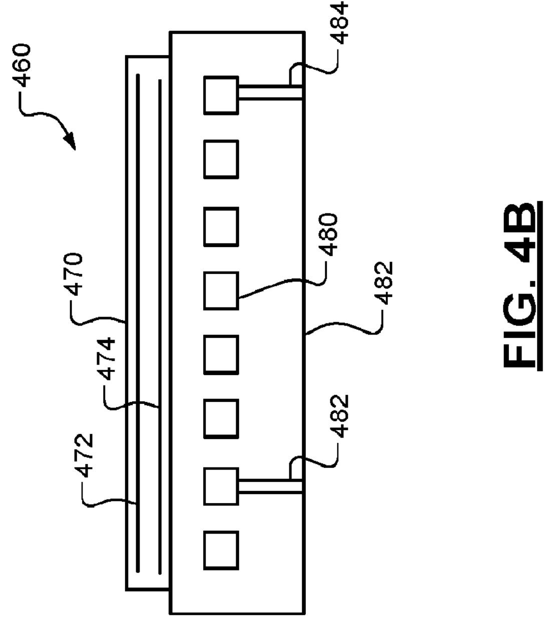
FIG. 4B is a simplified cross-section of an example of a substrate support.
Figure 4A:
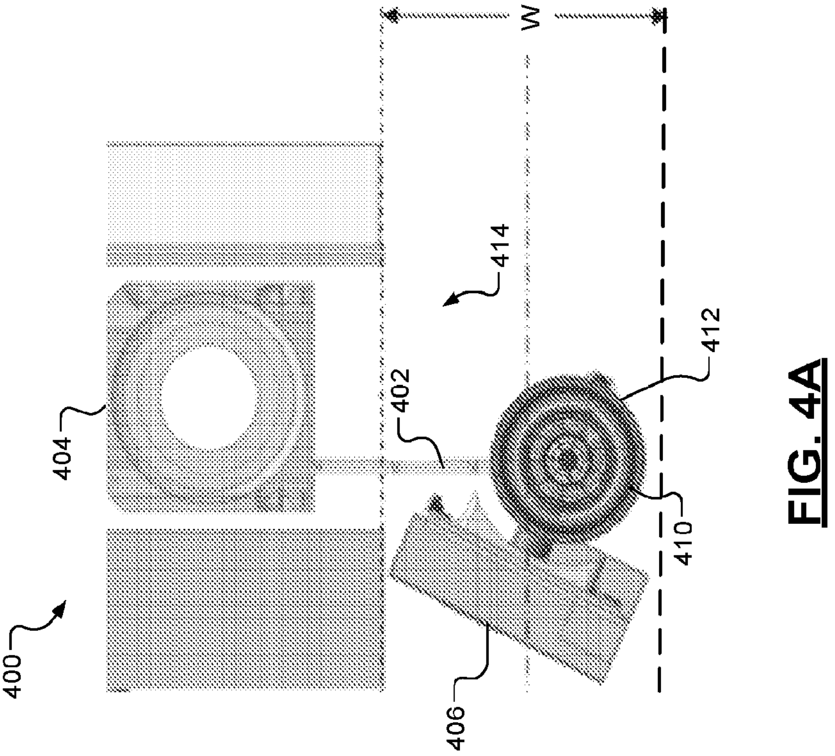
FIG. 4A is a top view of an example of a substrate processing station including a slide and pivot assembly.

FIG. 4A shows a substrate processing station 400 including a slide and pivot assembly 402. The slide and pivot assembly 402 allows a process module bias assembly 406 to slide and pivot relative to remaining components of a processing chamber 404. The slide and pivot assembly 402 allows the process module bias assembly 406 to be pulled out away from the processing chamber 404 and pivoted up to a predetermined angle (e.g., 115) relative to a front face of the processing chamber 404. The process module bias assembly 406 includes a housing 408, a portion 410 of a process module including a process bias bowl 412. The process module may include, in addition to the process bias bowl 412, an electrostatic chuck and/or other substrate support, and a top plate assembly as shown in FIG. 4B.

The example width W of an aisle between the station 400 and an opposing station is shown to illustrate that the process module bias assembly 406 is able to slide out and pivot within the aisle. This provides an open space 414 on a right side of the slide and pivot assembly 402 for a technician to access the process bias bowl 412 and an interior of the processing chamber 404 for service and maintenance purposes including wet cleaning. The process bias bowl 412 and an interior of the processing chamber 404 are accessed from a right side of the process module bias assembly 406 without interference. For example, no slides, rails and/or other components are located in the open space 414 and therefore they do not interfere with a technician accessing the interior of the processing chamber. Although the process module bias assembly 406 is shown pivoting to the left, the slide and pivot assembly may be configured and mounted on the right side of the processing chamber such that the process module and bias assembly pull out and pivot to the right relative to the processing chamber.

FIG. 4B shows a substrate support 460 including a heating layer 470 including electrostatic electrodes 472 and/or RF bias electrodes 474. The heating layer 470 may be made of ceramic or other material and is bonded by a bonding layer to a baseplate 482. The baseplate 482 is typically made of aluminum and includes coolant channels 480 and fluid passages 484 and 486 to supply coolant to and receive coolant from the baseplate 482. The coolant helps to control a temperature of the substrate support and the substrate during processing.

Figure 5:
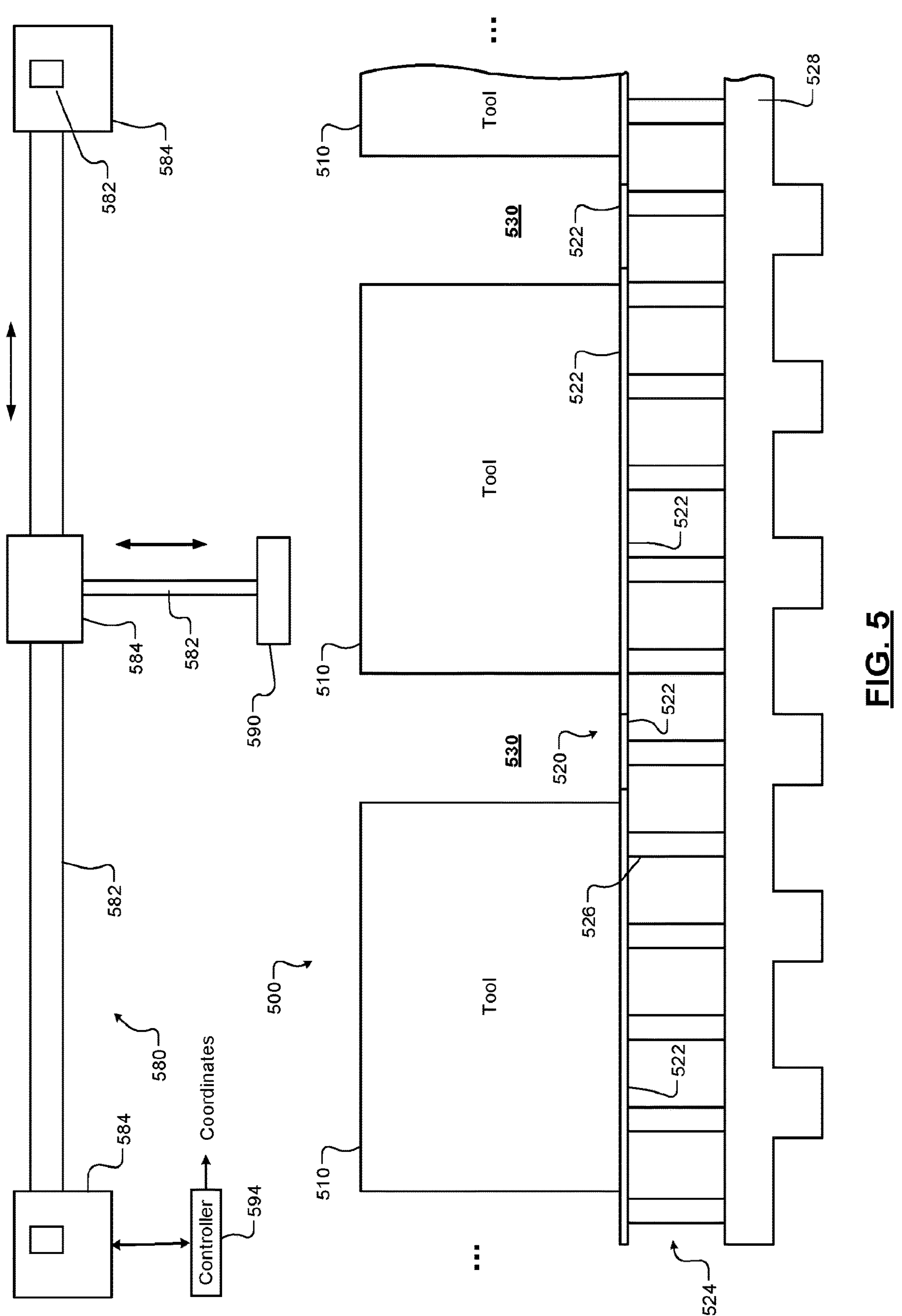
FIG. 5 is a partial side cross-sectional view illustrating a pedestal to support substrate processing tools above a pedestal frame according to the present disclosure.

FIG. 5 shows one or more substrate processing tools 510 arranged on one or more pedestals 520 including a plurality of pedestal plates 522. The plurality of pedestal plates 522 are supported by a pedestal frame 524 including a plurality of stanchions 526. The pedestal frame 524 is supported by a subfloor 528. In some examples, the one or more substrate processing tools 510 include stations arranged in rows and columns as described above in FIGS. 1 to 4B. Aisles 530 are located between the one or more substrate processing tools 510.

Weight-bearing points of each of the tools 510 (e.g., weight-bearing legs; not shown) may typically be arranged directed on the subfloor 528. For example, the subfloor 528 may be comprised of a plurality of removable tiles supported on a subfloor frame, and each of the tiles may be configured to support a certain load. As the footprint (area) of each of the tools 510 is reduced, a corresponding weight per unit area increases, and the weight distributed across the reduced footprint is relatively high. Accordingly, individual tiles of the subfloor 528 may not be able to directly support the weight-bearing points of the tools 510.

The pedestal 520 and stanchions 526 redistribute the weight of each of the tools 510. In other words, the weight distribution of the pedestal 520 and stanchions 526 across the subfloor 528 is different from the weight distribution of the tools 510 themselves. For example, the pedestal 520 redistributes the weight of individual ones of the tools 510 across a larger area of the subfloor 528 and/or across a greater number of tiles of the subfloor 528. In other words, the overall footprint of a portion of the pedestal 520 below each of the tools 510 is greater than an overall footprint of the tool 510. In some examples, the stanchions 526 are positioned such that the weight-bearing points of the pedestal 520 are aligned with the subfloor frame (i.e., load-bearing components of the subfloor frame that support the subfloor 528). In this manner, the stanchions 526 are positioned such that the overall weight supported by each unit area of the subfloor 528 (e.g., each tile) below the tool 510 is less than the weight associate with the corresponding weight-bearing points of the tool 510 located directly above the same unit area of the subfloor 528.

As can be appreciated, additional equipment to support the substrate processing tool are located below the substrate processing tools. For example, fluid chillers for heating and/or cooling, gas supply lines, electrical supply lines, seismic support frames and/or other components may need to be connected to the stations of the substrate processing tools through the pedestal 520 and/or subfloor 528. Access holes and mounting holes that are created on the pedestal plates need to be precisely aligned to allow connections to be made from the stations to the facilities components located below the pedestal plates 522. Furthermore, weight bearing legs that support frames of the stations, EFEM, substrate transfer module and other components need to avoid the access and/or mounting holes. Since the substrate processing tool is rather large, minor variations in lateral or angular alignment can create significant misalignment problems.

An overhead transport (OHT) system 580 of the fab room includes a substrate handling device 590 that can be used to deliver substrates to the substrate processing tools. In some examples, groups of substrates are delivered by the OHT system 580 to the FOUP described above. In some examples, the OHT system 580 includes one or more support frames 582 and motors and/or drive systems (or conveyors) 584 that move the substrate handling device 590 along the support frames in first, second and third directions. A controller 594 generates coordinates of the substrate handling device 590 during operation. In some examples, the coordinates from the OHT system 580 are used to align one or more of the pedestal plates 522. In some examples, the OHT system 580 includes position encoders and/or other sensors to determine the coordinates. In other examples, the position encoders and/or other sensors are omitted and the coordinates are determined in another manner. While the OHT is shown, a conveyor system mounted on the floor can also be used.

Figure 6:
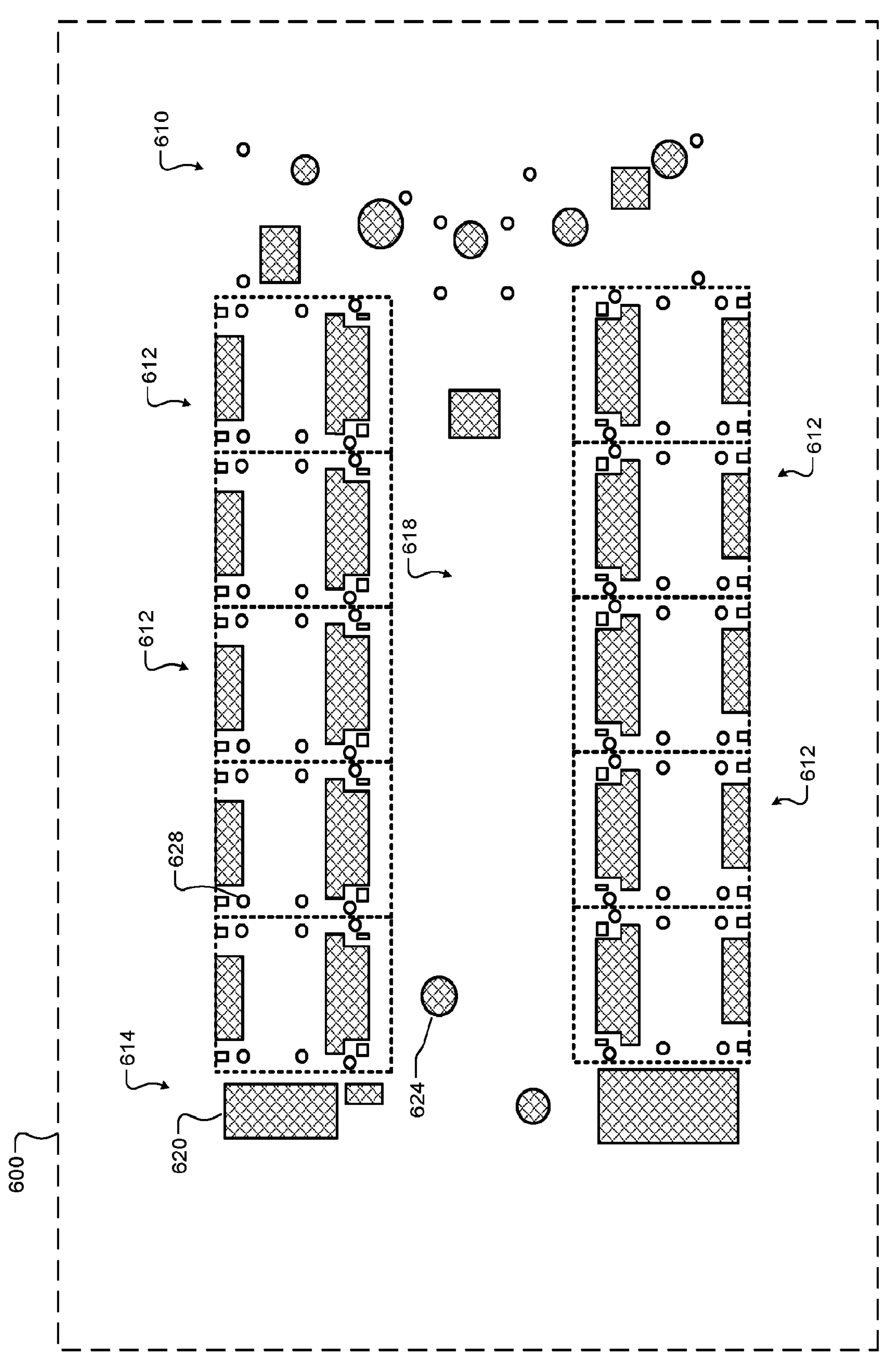
FIG. 6 is a plan view illustrating an access hole pattern and/or mounting pattern of an equipment service area for a substrate processing tool.

FIG. 6 shows an equipment service area 600 within which the substrate processing tool is located. Examples of a pattern of access holes, mounting locations and/or locations of weight-bearing frame legs are shown for an example tool including an EFEM and load lock (generally located at 610), one or more processing stations (generally located at 612), electrical service panels such as lock-out tag-out panels (generally located at 614), and a substrate transfer module (generally located at 618).

For examples, access holes for facilities connections are shown at 620. Access holes for forelines, gas lines, electrical lines and/or fluid lines are shown generally at 624. Locations of weight-bearing frame legs are shown at 628. As can be appreciated, the pattern is merely an example and other patterns can be used.

Once the substrate processing tool is assembled, the access holes, mounting locations, etc. on the pedestal plates need to align with the substrate processing tool and components located below the pedestal. Furthermore, the substrate processing tool needs to be located relative to the fab room within which it is located.

Figure 7:
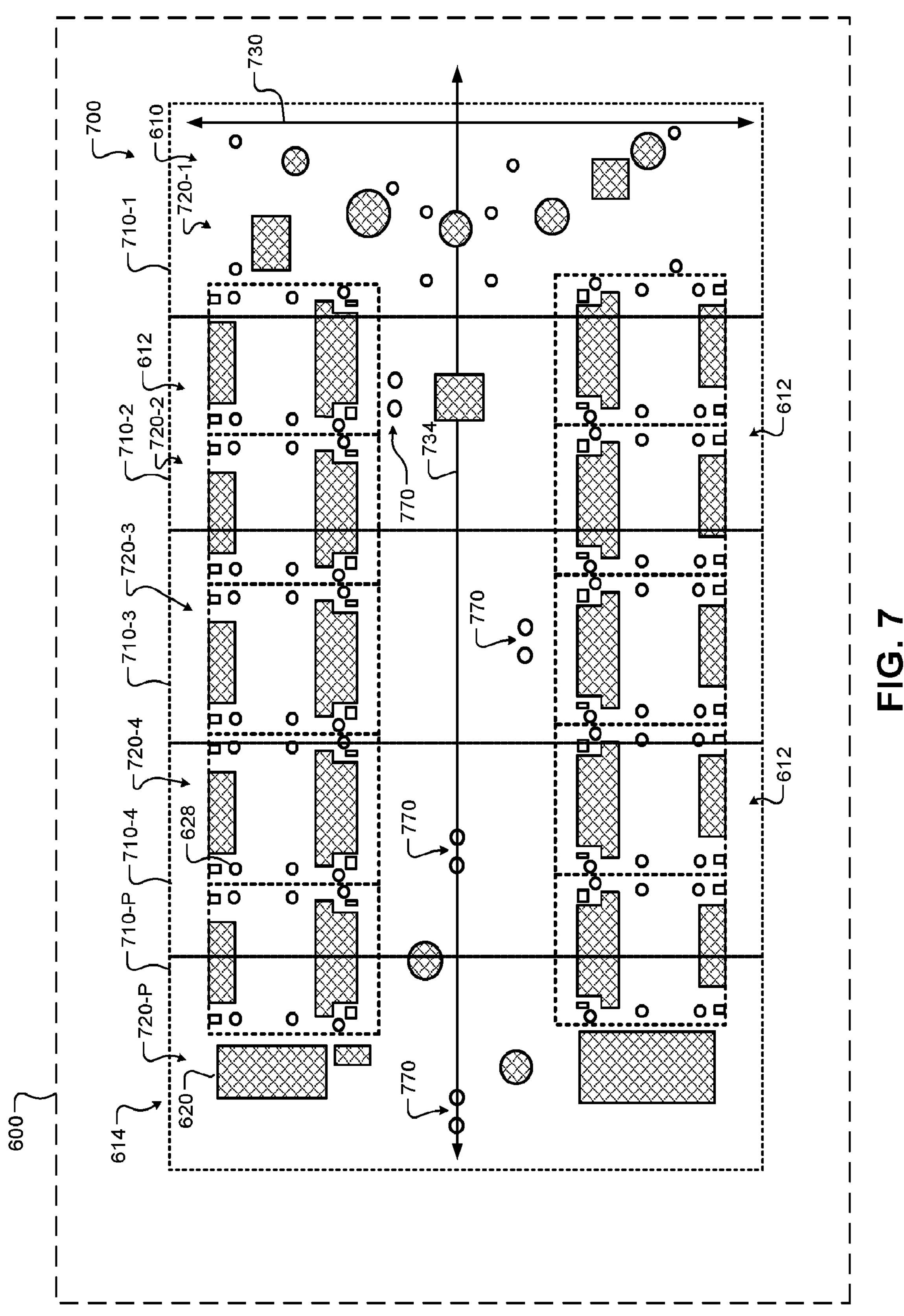
FIG. 7 is a plan view illustrating a plurality of pedestal plates to support the substrate processing tool according to the present disclosure.

FIG. 7 shows a pedestal 700 including a plurality of pedestal plates 710-1, 710-2, . . . , 710-P, (collectively pedestal plates 710), where P is an integer greater than one. As can be seen, a plurality of pedestal hole and mounting patterns 720-1, 720-2, . . . , 720-P, (collectively pedestal access hole and mounting patterns 720) define access holes, mounting locations, etc. for each of the plurality of pedestal plates 710-1, 710-2, . . . , 710-P, respectively. The pedestal access hole and mounting patterns 720 may be projected onto the plurality of pedestal plates 710-1, 710-2, . . . , 710-P, respectively by cutting the access holes and/or performing other suitable machining and/or marking.

In addition to defining the pedestal access hole and mounting patterns 720 for the plurality of pedestal plates 710-1, 710-2, . . . , 710-P, a first axis 730 and a second axis 734 are machined, scribed or otherwise applied to the plurality of pedestal plates 710-1, 710-2, . . . , 710-P. In some examples, the first axis 730 and the second axis 734 bisect at a right angle on at least one of the pedestal plates 522 and define an origin. In some examples, at least one of the first axis 730 and the second axis 734 extends across all of the plurality of pedestal plates 710-1, 710-2, . . . , 710-P to allow alignment in one of the axes (such as the second axis 734 in FIG. 7). For example in FIG. 7, the second axis 734 spans all of the pedestal plates 710.

In some examples, the first axis 730 (located solely on the pedestal plate 710-1 in this example) can be aligned using the OHT system that is normally used to deliver substrates to the substrate processing tools. Then, the remaining pedestal plates 710-2, . . . , 710-P can be installed in a side-by-side manner with respect to the pedestal plate 710-1. The second axis 734 can be used to align the plurality of pedestal plates 710-1, . . . , 710-P.

In some examples, the plurality of pedestal plates further include locating mounting holes and/or other indicia (such as origin marks) at 770 to allow a laser to be quickly located and oriented in at a predetermined location to allow further alignment of the plurality of pedestal plates 710. For example, the access holes and/or other indicia at 770 can be used to connect and/or align a laser directly the pedestal plate 710-P and/or to precisely position locating pins. The laser generates a laser line that can be used to determine the orientation of the pedestal plate 710-P relative to the pedestal plate 710-1 (which includes the first axis 730). Each of the pedestal plates can include one or more mounting holes and/or other indicia 770.

Figure 8:
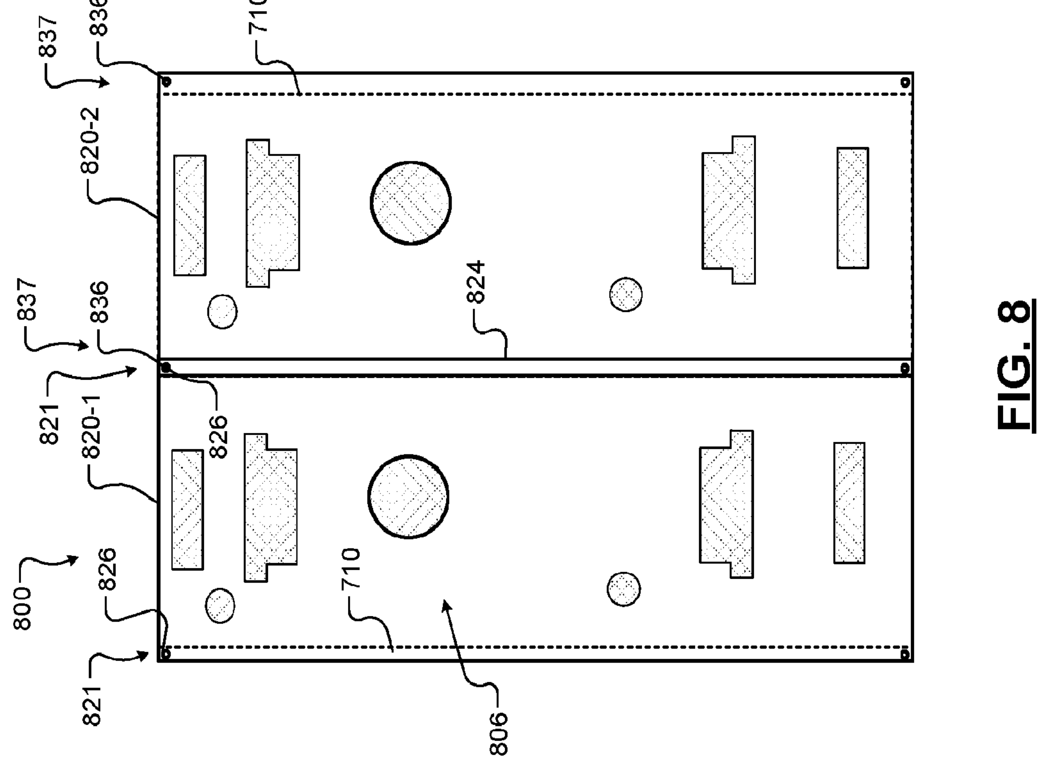
FIG. 8 is a plan view of adjacent transparent sheets with overlapping portions and alignment holes and/or other indicia according to the present disclosure.

FIG. 8 shows transparent films or sheets 800 that can be used for further alignment of the pedestal plates 710. For example, the transparent sheets 800 include a first transparent sheet 820-1 that optionally includes the access holes, mounting locations, alignment holes and/or other indicia (simplified and generally identified at 806) and further described with additional detail in FIG. 7). In addition, the first transparent sheet 820-1 further includes alignment holes and/or other indicia 826 located in overlapping portions 821 of the first transparent sheet 820-1.

In some examples, the alignment holes and/or indicia 826 are located in corners of the first transparent sheet 820-1 in the overlapping portions 821. A second transparent sheet 820-2 similarly includes access holes and/or indicia 836. In some examples, the access holes and/or indicia 836 are also located in corners of the second transparent sheet 820-2 in overlapping portions 837.

After initially positioning at least one of the plurality of pedestal plates 710 using the first axis 730 and the OHT system, the transparent sheets 800 can be used to further align the rest of the pedestal plates relative to one another along the second axis 734. The transparent sheets 800 are overlaid onto the corresponding ones of the pedestal plates 710. If the plurality of pedestal plates are properly aligned, the alignment holes and/or indicia of each of the transparent sheets should also be aligned. If the alignment holes and/or indicia are not aligned, the pedestal plates can be moved until they are aligned. The transparent sheets 800 help to align the pedestal plates 710-2 to 710-P to the pedestal plate 710-1.

In some examples, the plurality of pedestal plates further include the access holes and/or indicia at 770 to additionally allow a laser to be quickly located in a predetermined location, orientation and/or origin to allow further relative alignment of the plurality of pedestal plates 710.

Figure 9:
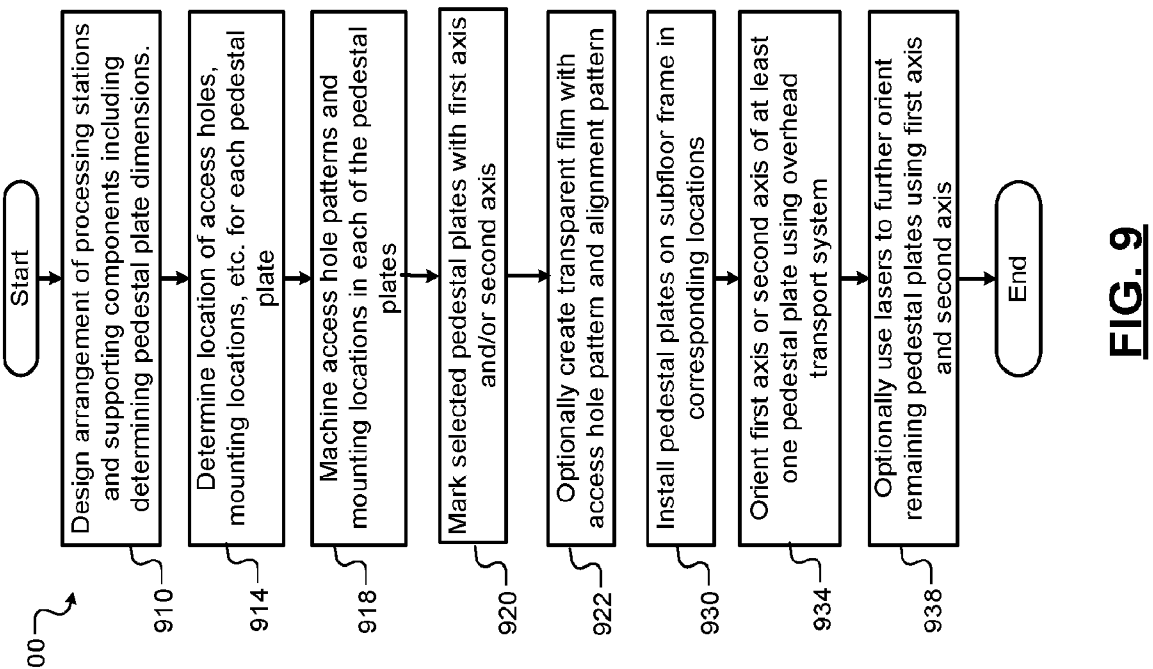
FIG. 9 is a flowchart of an example of a method for aligning a substrate processing tool in a fab room according to the present disclosure.

FIG. 9 shows an example of a method 900 for locating one or more substrate processing tools within a semiconductor fab room. At 910, an arrangement of processing stations and/or supporting components of a semiconductor processing tool are designed. As part of this process, the number, orientation and/or size of the pedestal plates 710 underlying each of the substrate processing tools are determined. In some examples, the pedestal plates have the same dimensions in one or more direction, although different dimensions can be used.

At 914, locations of installation features such as access holes, mounting locations, etc. are determined for each of the components of the substrate processing tool. The installation features correspond to connections between components of the substrate processing tool and components arranged below the pedestal, below the subfloor, etc. The locations of the access holes, mounting locations, etc. are projected onto each of the pedestal plates 710. At 918, the access hole patterns and/or mounting locations are machined into each of the pedestal plates. At 920, the pedestal plates 710 are marked with a first axis and a second axis. In some examples, one or both of the first axis and the second axis are marked on some or all of the plurality of pedestal plates 710. For example, all of the plates in FIG. 7 are marked with the second axis 734 and only one of the plates is marked with the first axis 730. The second axis 734 bisects the first axis 730 at a right angle.

At 922, an installation template such as a transparent film or sheet is optionally created with the access hole patterns, alignment patterns, etc. printed and/or cut into the installation template. In some examples, some of the alignment patterns are created in overlapping portions of the installation template. In some examples, the installation template is a visual template that is generated and projected onto the one or more of the pedestal plates. For example, a projection device may be arranged in a predetermined, calibrated position within the fab room and configured to project light (e.g., visible laser light) in the shape of the installation template onto the pedestal plate.

At 930, the pedestal plates are installed on a subfloor frame in their respective locations. At 934, at least one of the first axis or the second axis is aligned to the fab room using the OHT system. For example, the OHT system can be used to move along and/or define points along a predetermined line corresponding to the first axis and/or the second axis. In some examples, the OHT system is used to position and orient a laser that projects onto one or more of the pedestal plates. The pedestal plates are aligned using the laser light. Once one of the first axis or the second axis is oriented correctly, the remaining pedestal plates can be installed and oriented relative to the established axis. In some examples, the transparent sheet can be used to align one pedestal plate relative to the adjacent neighboring pedestal plates. Furthermore, lasers can be located using the predefined access holes and/or indicia and to generate additional orientation information to allow the pedestal plates to be aligned.

In some examples, an error can be made when installing the pedestal plates. In other words, there is a shift between plates in along the first axis 730 (e.g. the x-direction). A laser level is directed across the pedestal plates from the EFEM end of system. The laser light is calibrated using the OHT line and projected at 90 degrees across varied height locating pins that are arranged in mounting holes at various locations of the pedestal plates.

In some examples, an error can be made when machining a pedestal plate. The transparent sheet described above can be overlaid onto a corresponding one of the pedestal plates and the alignment holes, the mounting holes, the access holes and/or other indicia can be used to determine whether or not the machining of the pedestal plate was done correctly.

In some examples, errors in positioning the EFEM in along the second axis 734 (the y-direction) can be made. The stations can be initially aligned using the OHT system and a laser level. The EFEM can then be aligned using the stations.

In some examples, errors in positioning the EFEM in along the first axis 730 (the x-direction) can be made. In some examples, the EFEM includes a center mark. A laser level is located at the end of the tool opposite to the EFEM. The laser level can be located by one of the mounting holes and/or aligned using other indicia. The laser appears on the EFEM and the relative location of the EFEM can be determined.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for arranging a substrate processing tool on a pedestal within a semiconductor fabrication room, wherein the pedestal includes a plurality of pedestal plates supported by a pedestal frame including a plurality of stanchions, the method comprising:

determining dimensions of the pedestal plates;

determining locations of installation features of the pedestal plates in accordance with components of the substrate processing tool;

generating an installation template indicating the locations of the installation features;

machining the installation features in the pedestal plates based on the determined locations, using the installation template;

marking at least one of the pedestal plates with at least one alignment feature;

installing the pedestal frame on a subfloor of the semiconductor fabrication room, wherein the stanchions of the pedestal frame are positioned such that a weight distribution of the pedestal frame on the subfloor is different from a weight distribution of the substrate processing tool;

orienting the at least one of the pedestal plates with the at least one alignment feature using an overhead transport system; and installing the pedestal plates on the pedestal frame in accordance with the installation features in the pedestal plates and the at least one alignment feature.

2. The method of claim 1, further comprising installing the substrate processing tool on the pedestal plates.

3. The method of claim 1, wherein an overall footprint of the pedestal is greater than an overall footprint of the substrate processing tool.

4. The method of claim 1, wherein the installation features include at least one of access holes for the components of the substrate processing tool and mounting locations for the pedestal plates.

5. The method of claim 1, wherein the at least one alignment feature includes an axis of the pedestal plate.

6. The method of claim 1, wherein the installation template is a transparent sheet indicating the locations of the installation features.

7. The method of claim 1, wherein the installation template is visual template indicating the locations of the installation features that is generated and projected onto the pedestal plates.

8. The method of claim 1, wherein installing the pedestal plates includes (i) installing the at least one of the pedestal plates with the at least one alignment feature and (ii) installing remaining ones of the pedestal plates based on the at least one alignment feature.

9. The method of claim 1, further comprising installing a plurality of the substrate processing tools on the pedestal plates.

* * * * *